United States Patent
Suzuki et al.

(10) Patent No.: US 10,353,057 B2
(45) Date of Patent: *Jul. 16, 2019

(54) PHOTODETECTOR AND LIDAR SYSTEM INCLUDING THE PHOTODETECTOR

(71) Applicant: KABUSHIKI KAISHA TOSHIBA, Tokyo (JP)

(72) Inventors: Kazuhiro Suzuki, Tokyo (JP); Keita Sasaki, Kanagawa (JP); Hideyuki Funaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 374 days.

This patent is subject to a terminal disclaimer.

(21) Appl. No.: 15/218,423

(22) Filed: Jul. 25, 2016

(65) Prior Publication Data

US 2017/0031010 A1   Feb. 2, 2017

(30) Foreign Application Priority Data

Jul. 28, 2015   (JP) .................................. 2015-148959

(51) Int. Cl.

| G01C 3/08 | (2006.01) |
| G01S 7/486 | (2006.01) |
| H01L 31/107 | (2006.01) |
| H01L 31/0352 | (2006.01) |
| H01L 27/146 | (2006.01) |
| G01S 17/89 | (2006.01) |
| G01S 7/481 | (2006.01) |
| H01L 27/02 | (2006.01) |

(52) U.S. Cl.
CPC .......... *G01S 7/4865* (2013.01); *G01S 7/4817* (2013.01); *G01S 17/89* (2013.01); *H01L 27/14629* (2013.01); *H01L 27/14636* (2013.01); *H01L 27/14643* (2013.01); *H01L 31/035272* (2013.01); *H01L 31/107* (2013.01); *H01L 27/0248* (2013.01)

(58) Field of Classification Search
CPC ...... G01S 7/4865; G01S 7/4817; G01S 17/89; H01L 31/107; H01L 31/035272; H01L 27/14643; H01L 27/14629
USPC ....................................................... 356/5.01
See application file for complete search history.

(56) References Cited

U.S. PATENT DOCUMENTS

| 8,492,726 B2 | 7/2013 | Yokoyama et al. |
| 8,629,485 B2 | 1/2014 | Yamamura et al. |
| 8,994,135 B2 | 3/2015 | Yamamura et al. |

(Continued)

FOREIGN PATENT DOCUMENTS

| CN | 101363914 A | 2/2009 |
| JP | H11-39598 A | 2/1999 |

(Continued)

*Primary Examiner* — Mark Hellner
(74) *Attorney, Agent, or Firm* — Finnegan, Henderson, Farabow, Garrett & Dunner, L.L.P.

(57) ABSTRACT

A photodetector according to an embodiment includes: a first semiconductor layer of a first conductivity type, including a first surface and a second surface that is opposite to the first surface; a second semiconductor layer of a second conductivity type, disposed on the second surface; and at least one photo-sensing device including a region in the first semiconductor layer, a region in the second semiconductor layer, and a first electrode disposed in a first region of the first surface.

14 Claims, 7 Drawing Sheets

(56) References Cited

U.S. PATENT DOCUMENTS

| | | | |
|---|---|---|---|
| 9,691,932 B2 * | 6/2017 | Sasaki | H01L 31/103 |
| 2008/0135963 A1 * | 6/2008 | Akiyama | H01L 27/14603 |
| | | | 257/432 |
| 2009/0121306 A1 | 5/2009 | Ishikawa | |
| 2011/0042576 A1 | 2/2011 | Wilson et al. | |
| 2011/0298076 A1 * | 12/2011 | Yamamura | H01L 27/1446 |
| | | | 257/432 |
| 2016/0079464 A1 | 3/2016 | Sasaki et al. | |

FOREIGN PATENT DOCUMENTS

| | | |
|---|---|---|
| JP | 2000-269537 A | 9/2000 |
| JP | 2006-179628 | 7/2006 |
| JP | 2008-153311 | 7/2008 |
| JP | 2010-226071 | 10/2010 |
| JP | 2011-44717 A | 3/2011 |
| JP | 2011-187607 A | 9/2011 |
| JP | 2012-112726 | 6/2012 |
| JP | 2013-65911 | 4/2013 |
| JP | 2016-62995 | 4/2016 |

\* cited by examiner

LIGHT IRRADIATION DIRECTION

PHOTODETECTOR AND LIDAR SYSTEM INCLUDING THE PHOTODETECTOR

CROSS REFERENCE TO RELATED APPLICATIONS

This application is based upon and claims the benefit of priority from prior Japanese Patent Application No. 2015-148959 filed on Jul. 28, 2015 in Japan, the entire contents of which are incorporated herein by reference.

FIELD

Embodiments described herein relate generally to photodetectors and light detection and ranging (LIDAR) systems including the photodetectors.

BACKGROUND

Silicon photomultipliers ("SiPM") are photo-sensing devices including a two-dimensionally arranged avalanche photodiode ("APD") array. If a reverse-bias voltage higher than the APD breakdown voltage is applied to an APD, the APD is operated in Geiger mode. The gain of the APD in Geiger mode is very high, on the order of $10^5$ to $10^6$. This enables the APD to measure subtle light of a single photon. Since a high reverse-bias voltage needs to be applied to a SiPM to operate, typically the thickness of a depletion layer of each APD is 2 µm to 3 µm, and the reverse-bias voltage is 100V or less. The spectral sensitivity characteristic of a SiPM considerably depends on the absorption characteristic of silicon, and has a peak between 400 nm to 600 nm. The SiPMs are hardly sensitive to photons in the near-infrared wavelength band, which is 800 nm or more.

Some photo-sensing devices including silicon are known to have a very thick depletion layer, several tens µm, to become sensitive to photons in the near-infrared wavelength band. In this case, however, the drive voltage becomes very high, several hundreds V. Therefore, miniaturization APD arrays like those of SiPMs have not been achieved yet.

Other photo-sensing devices are known, in which the back side of a silicon substrate is made to have an irregular scattering surface by means of laser processing technology, so that unabsorbed light is reflected on the scattering surface. However, it is difficult to form a scattering and reflecting surface that is suitable for light in the near-infrared wavelength band. Furthermore, these photo-sensing devices require dedicated laser processing apparatus and method, which may increase the costs. In addition, mechanically processing a silicon layer of a diode included in a photo-sensing device may be equivalent to forming a detective layer, which may cause a problem in electric characteristics of the photo-sensing device such as stability, yield, and reproducibility.

DETAILED DESCRIPTION

A photodetector according to an embodiment includes: a first semiconductor layer of a first conductivity type, including a first surface and a second surface that is opposite to the first surface; a second semiconductor layer of a second conductivity type, disposed on the second surface; and at least one photo-sensing device including a region in the first semiconductor layer, a region in the second semiconductor layer, and a first electrode disposed in a first region of the first surface.

Embodiments will now be explained with reference to the accompanying drawings.

First Embodiment

Figure 1:
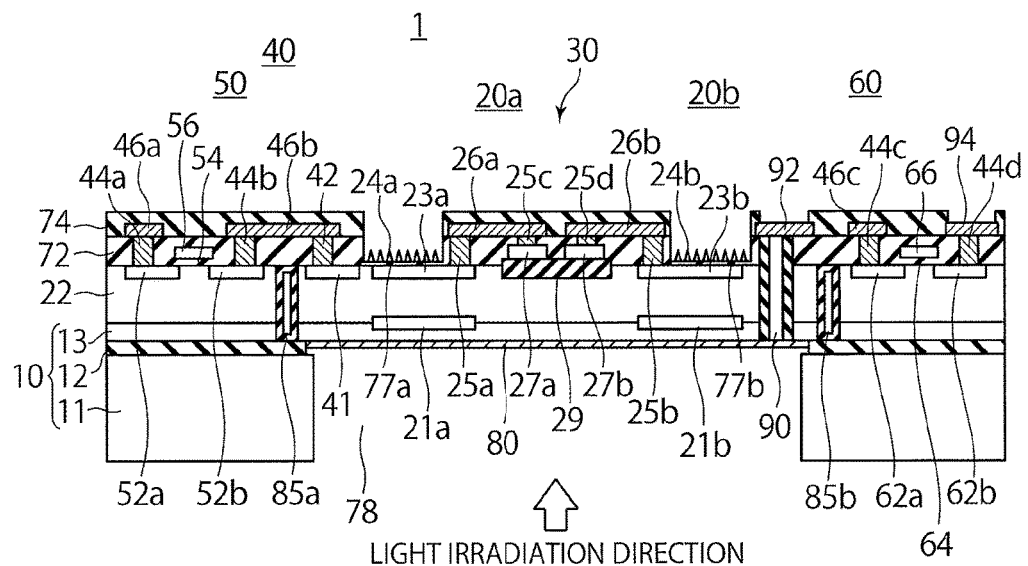
FIG. 1 is a cross-sectional view illustrating a photodetector according to a first embodiment.

FIG. 1 is a schematic cross-sectional view of a photodetector according to a first embodiment. The photodetector 1 of the first embodiment is disposed on a silicon on insulator (SOI) substrate 10, and includes a photodetector region 30 with a plurality of (two in FIG. 1) photo-sensing devices 20a and 20b configured to detect light and convert the light to an electrical signal, and a periphery region 40 including a periphery circuit (CMOS circuit) with transistors 50 and 60 configured to process the electrical signal converted by the photo-sensing devices 20a and 20b. The SOI substrate 10 has a multilayer structure in which a silicon support substrate 11, a buried oxide ("BOX") film 12, and an n-type semiconductor layer 13 to serve as an active layer are stacked in this order.

The photo-sensing device 20a includes a part of the n-type semiconductor layer 13, a $p^+$-type semiconductor layer 21a disposed on the part of the n-type semiconductor layer 13, a part of a $p^-$-type semiconductor layer 22, a $p^+$-type semiconductor layer 23a disposed on the part of the $p^-$-type semiconductor layer 22, a light reflecting member 24a disposed on the $p^+$-type semiconductor layer 23a, a contact 25a on the $p^+$-type semiconductor layer 23a, a wiring line 26a connecting to the contact 25a, and a quenching resistor 27a connecting to the wiring line 26a. An impurity region (conductor region) 41 is disposed on the part of the $p^-$-type semiconductor layer 22 of the photo-sensing device 20a.

The photo-sensing device 20b includes a part of the n-type semiconductor layer 13, a $p^+$-type semiconductor layer 21b disposed on the part of the n-type semiconductor layer 13, a part of the $p^-$-type semiconductor layer 22, a $p^+$-type semiconductor layer 23b disposed on the part of the $p^-$-type semiconductor layer 22, a light reflecting member 24b disposed on the $p^+$-type semiconductor layer 23b, a contact 25b on the $p^+$-type semiconductor layer 23b, a wiring line 26b connecting to the contact 25b, and a quenching resistor 27b connecting to the wiring line 26b. In the first embodiment, the photo-sensing devices 20a and 20b are vertical photodiodes.

An opening 78 is formed through the silicon support substrate 11 and the buried oxide film 12 to expose a part of the n-type semiconductor layer 13 on a side opposite to the photo-sensing devices 20a and 20b in the photodetector region 30. A transparent electrode 80 is disposed on the exposed part of the n-type semiconductor layer 13. The transparent electrode 80 is formed of an electrode material transmitting the near-infrared rays (with the wave length of, for example, 850 nm), such as indium tin oxide (ITO), and shared by the photo-sensing devices 20a and 20b. Light enters the photodetector 1 from the side where the opening 78 is present.

The transistor 50 includes a source 52a and a drain 52b which are separately disposed in a part of the p⁻-type semiconductor layer 22, a gate insulating film 54 disposed on a region (channel region) between the source 52a and the drain 52b in the p⁻-type semiconductor layer 22, and a gate electrode 56 disposed on the gate insulating film 54.

The transistor 60 includes a source 62a and a drain 62b which are separately disposed in a part of the p⁻-type semiconductor layer 22, a gate insulating film 64 disposed on a region (channel region) between the source 62a and the drain 62b in the p⁻-type semiconductor layer 22, and a gate electrode 66 disposed on the gate insulating film 64.

The quenching resistors 27a and 27b in the photodetector region 30 and the transistors 50 and 60 in the periphery region 40 are covered by an interlayer insulating film 72. The wiring lines 26a and 26b are disposed on the interlayer insulating film 72 in the photodetector region 30. One end of the wiring line 26a is connected to the p⁺-type semiconductor layer 23a via the contact 25a in the interlayer insulating film 72, and the other end is connected to the quenching resistor 27a via a contact 25c in the interlayer insulating film 72. One end of the wiring line 26b is connected to the p⁺-type semiconductor layer 23b via the contact 25b in the interlayer insulating film 72, and the other end is connected to the quenching resistor 27b via the contact 25d in the interlayer insulating film 72.

Wiring lines 46a, 46b, and 46c are disposed on the interlayer insulating film 72 in the periphery region 40, and connected to the source 52a, the drain 52b, and the source 62a, respectively, via contacts 44a, 44b, and 44c in the interlayer insulating film 72. The wiring line 46b is also connected to the impurity region 41 via a contact 42.

The wiring lines 26a and 26b in the photodetector region 30 and the wiring lines 46a, 46b, and 46c in the periphery region 40 are covered by an interlayer insulating film 74. The interlayer insulating films 72 and 74 have openings in regions in which the light reflecting members 24a and 24b of the photo-sensing devices 20a and 20b are exposed. The light reflecting members 24a and 24b are disposed on the p⁺-type semiconductor layers 23a and 23b via thin insulating layers 77a and 77b. The light reflecting members 24a and 24b are formed of a material reflecting light in a wavelength range from visible light to near-infrared light.

A device isolation structure 85a is disposed between the photo-sensing device 20a and the periphery region 40 including the transistor 50, and a device isolation structure 85b is disposed between the photo-sensing device 20b and the periphery region 40 including the transistor 60. The device isolation structures 85a and 85b are deep trench isolation (DTI) structures, and penetrate the n-type semiconductor layer 13 and the p⁻-type semiconductor layer 22. The device isolation structures 85a and 85b may surround the photodetector region 30.

The interlayer insulating film 74 has a first opening and a second opening, in which a pad 92 and a pad 94 are disposed, respectively. The pad 92 is connected to a through-electrode 90. The pad 94 is connected to the drain 44a of the transistor 60 via a contact 44d in the interlayer insulating film 72.

As described above, the photo-sensing devices 20a and 20b are vertical photodiodes. Therefore, a potential is applied between upper and lower terminals of the photo-sensing devices 20a and 20b. A front electrode connecting to anodes of the photo-sensing devices 20a and 20b also connects to an I/O terminal of the CMOS circuit. A back electrode 80 corresponding to cathodes of the photo-sensing devices 20a and 20b is separately formed. The through-electrode 90 serves as a wiring line that is in contact with the electrode 80, which will serve as a cathode later. An end of the through-electrode 90 is connected to the surface of the photodetector 1.

Thus, the through-electrode 90 penetrates the interlayer insulating film 72, the p⁻-type semiconductor layer 22, and the n-type semiconductor layer 13 and reaches the electrode 80.

Figure 2:
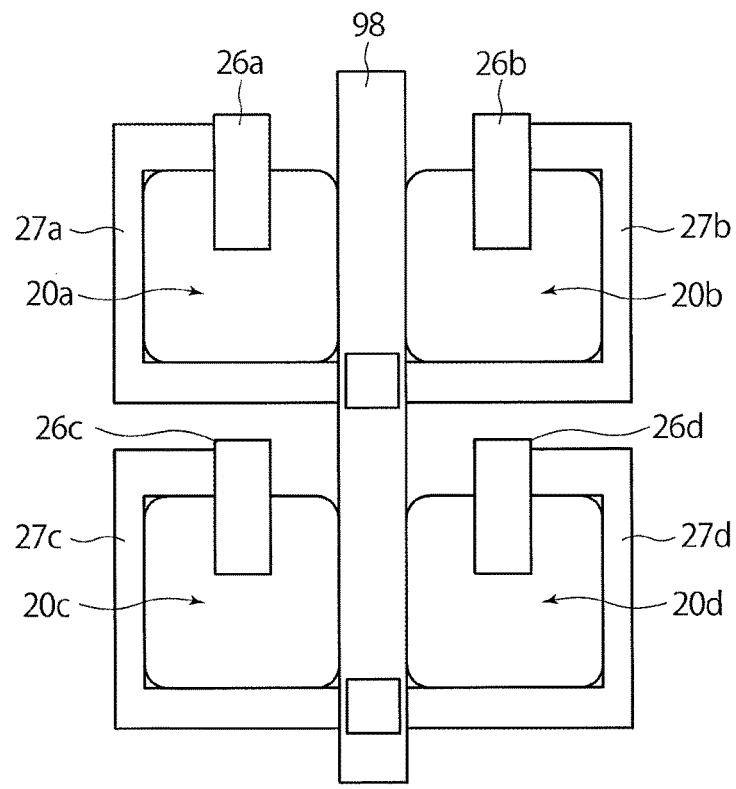
FIG. 2 illustrates a photo-sensing device array, in which photo-sensing devices according to the first embodiment are arranged in an array form.

The conductor of the through-electrode 90 is surrounded by an insulating material. The insulating material electrically isolates the conductor of the through-electrode 90 from the n-type semiconductor layer 13 and the p⁻-type semiconductor layer 22. The photodetector 1 having the aforementioned structure includes a plurality of photo-sensing devices which are typically arranged in an array as shown in FIG. 2. FIG. 2 is a top view of an array including photo-sensing devices 20a, 20b, 20c, and 20d arranged in two rows and two columns. As can be understood from FIG. 2, the photo-sensing device 20a is partially surrounded by a quenching resistor 27a, the photo-sensing device 20b is partially surrounded by a quenching resistor 27b, the photo-sensing device 20c is partially surrounded by a quenching resistor 27c, and the photo-sensing device 20d is partially surrounded by a quenching resistor 27d. The photo-sensing device 20a is connected to one end of the quenching resistor 27a via a wiring line 26a, the photo-sensing device 20b is connected to one end of the quenching resistor 27b via a wiring line 26b, the photo-sensing device 20c is connected to one end of the quenching resistor 27c via a wiring line 26c, and the photo-sensing device 20d is connected to one end of the quenching resistor 27d via a wiring line 26d. A wiring line 98 disposed between photo-sensing devices 20a and 20b adjacent to each other in a row direction (horizontal direction in FIG. 2), and between the photo-sensing devices 20c and 20d adjacent to each other in a row direction, as shown in FIG. 2. The other ends of the quenching resistors 26a, 26b, 26c, and 26d are connected to the wiring line 98. Thus, the photo-sensing devices 20a, 20b, 20c, and 20d arranged in an array are connected in parallel to one another in this embodiment.

The photodetector 1 having this structure becomes a silicon photomultiplier (SiPM). Each of the photo-sensing devices 20a, 20b, 20c, and 20d becomes an avalanche photodiode (APD).

The operation of the photodetector 1 according to the first embodiment will be described with reference to FIG. 1. A reverse-bias is applied to the photo-sensing devices 20a and 20b. The reverse-bias is applied between the pad 92 shown in FIG. 1 and the wiring line 98 shown in FIG. 2. The potential applied to the pad 92 is also applied to the n-type semiconductor layer 13 via the through-electrode 90 and the electrode 80, and the potential applied to the wiring line 98 is also applied to the p'-type semiconductor layers 23a and 23b via the quenching resistors 27a and 27b, the contacts 25c and 25d, the wiring lines 26a and 26b, and the contacts 25a and 25b.

Light entering the photodetector 1 via the electrode 80 generates electron-hole pairs in a depletion layer in the vicinity of the interface between a part of the n-type semiconductor layer 13 and the p$^+$-type semiconductor layer 21a and between a part of the n-type semiconductor layer 13 and the p$^+$-type semiconductor layer 21b in the photo-sensing devices 20a and 20b. Since the reverse-bias is applied, the generated electrons flow to the n-type semiconductor layer 13, and the generated holes flow to the p$^+$-type semiconductor layers 23a and 23b. However, a part of the electrons and a part of the holes collide with other atoms in the p$^-$-type semiconductor layer 22 and the p$^+$-type semiconductor layers 23a and 23b to generate new electron-hole pairs. A chain reaction occurs, in which the newly generated electrons and the newly generated holes further collide with other atoms to generate more electron-hole pairs. As a result, avalanche multiplication, in which a photocurrent caused by incident light is multiplied, occurs. The multiplied photocurrent flows through the quenching resistors 27a and 27b and the wiring line 98, and is read by a readout circuit that is not shown. A part of the holes flowing to the p$^+$-type semiconductor layers 23a and 23b is reflected by the light reflecting members 24a and 24b, flows back to the p$^-$-type semiconductor layer 22, and collides with other atoms to contribute to the generation of new electron-hole pairs. Thus, the light reflecting members 24a and 24b improve the avalanche multiplication rate. The p$^+$-type semiconductor layers 23a and 23b are called as avalanche layers.

An analog front end circuit including the aforementioned readout circuit for processing signals from the photo-sensing devices, and an active quenching circuit that allows active termination of the Geiger discharge are formed in the periphery region 40.

(Manufacturing Method)

A method of manufacturing the photodetector according to the first embodiment will be described with reference to FIGS. 3 to 11.

Figure 3:
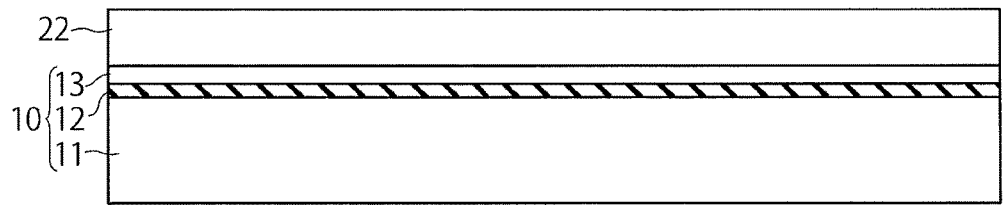
FIGS. 3 to 10 are cross-sectional views illustrating a process of manufacturing the photodetector according to the first embodiment.

First, an SOI substrate 10 is prepared as shown in FIG. 3. The SOI substrate 10 has a structure in which a Si support substrate 11, a BOX film 12, and an active layer (n-type semiconductor layer) 13 are stacked in this order. A p$^-$-type semiconductor layer 22 is epitaxially grown on the n-type semiconductor layer 13. Subsequently, device isolation structures 85a and 85b for separating a photodetector region 30 and a periphery region 40 are formed. The device isolation structures 85a and 85b are DTI structures. Each DTI structure is formed by making an opening that penetrates the p$^-$-type semiconductor layer 22 and the n-type semiconductor layer 13 to reach the BOX film, and oxidizing the side surface of the opening.

Figure 4:
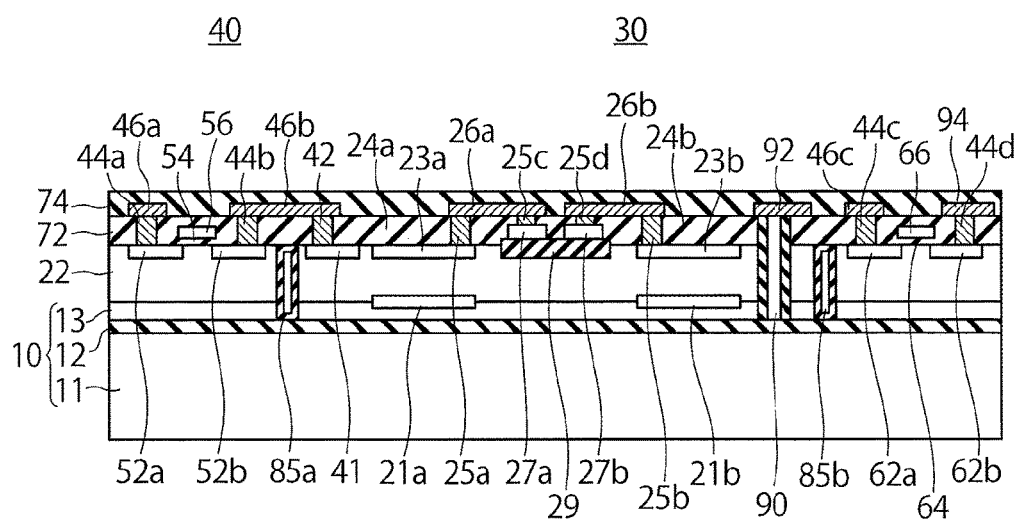

Thereafter, an impurity (for example, boron) is implanted to regions of the p$^-$-type semiconductor layer 22, in which photo-sensing devices are to be formed, to form p$^+$-type semiconductor layers 21a and 21b to be included in photo-sensing devices in the active layer 13 of the SOI substrate 10 (FIG. 4). Then, a device isolation structure 29 is formed between adjacent photo-sensing devices as shown in FIG. 4 so that the regions in which the photo-sensing devices are disposed do not interfere with each other. The device isolation structure 29 may be a locally oxidized device isolation structure (local oxidation of silicon (LOCOS) structure).

A first mask that is not shown is formed on the p$^-$-type semiconductor layer 22 and an n-type impurity is implanted using the first mask to form a source 52a, a drain 52b, a source 62a, and a drain 62b in a region of the p$^-$-type semiconductor layer 22 that will become a periphery region 40, and an impurity region 41 in a region of the p$^-$-type semiconductor layer 22 that will become a light detection region, as shown in FIG. 4. After the first mask is removed, a second mask, which is not shown, is formed on the p$^-$-type semiconductor layer 22. A p-type impurity is implanted using the second mask to form p$^+$-type semiconductor layers 23a and 23b in a region of the p$^-$-type semiconductor layer 22 that will become a light detection region. This forms the light detection regions of the photo-sensing devices 20a and 20b. After the second mask is removed, a gate insulating film 54 is formed on a region, which will become a channel, of the p$^-$-type semiconductor layer 22 between the source 52a and the drain 52b, and a gate insulating film 64 is formed on a region, which will become a channel, of the p$^-$-type semiconductor layer 22 between the source 62a and the drain 62b. Thereafter, gate electrodes 56 and 66 are formed on the gate insulating films 54 and 64, respectively.

Subsequently, quenching resistors 27a and 27b are formed. The quenching resistor 27a is connected in series with the photo-sensing device 20a so as to be in contact with a part of the light detection region of the photo-sensing device 20a, and the quenching resistor 27b is connected in series with the photo-sensing device 20b so as to be in contact with a part of the light detection region of the photo-sensing device 20b. The quenching resistors 27a and 27b are also disposed on the device isolation structure 29 as shown in FIG. 4.

Thereafter, an insulating film 72 is formed on the p$^-$-type semiconductor layer 22 to cover the quenching resistors 27a and 27b as shown in FIG. 4. Openings connecting to the source 52a, the drain 52b, the impurity region 41; the p$^{30}$-type semiconductor layers 23a and 23b, the quenching resistors 27a and 27b, the source 62a, and the drain 62b are formed in the insulating film 72 using a lithographic technique. The openings are filled with a conductive material, tungsten for example, to form contacts 44a, 44b, 42, 25a, 25b, 25c, 25d, 44c, and 44d. Another opening is formed through the insulating film 72, the p$^-$-type semiconductor layer 22, and the n-type semiconductor layer 13 to reach the BOX film 12 using a lithographic technique. The side surface of the opening is oxidized to form an insulating film. The opening is then filled with a conductive material, tungsten for example, to form a through-electrode 90.

Wiring lines 46a, 46b, 26a, 26b, 46c, and 46d and a pad 92 are formed on the insulating film 72 using a lithographic technique. An insulating film 74 is formed to cover the wiring lines 46a, 46b, 26a, 26b, 46c, and 46d and the pad 92.

Figure 5:
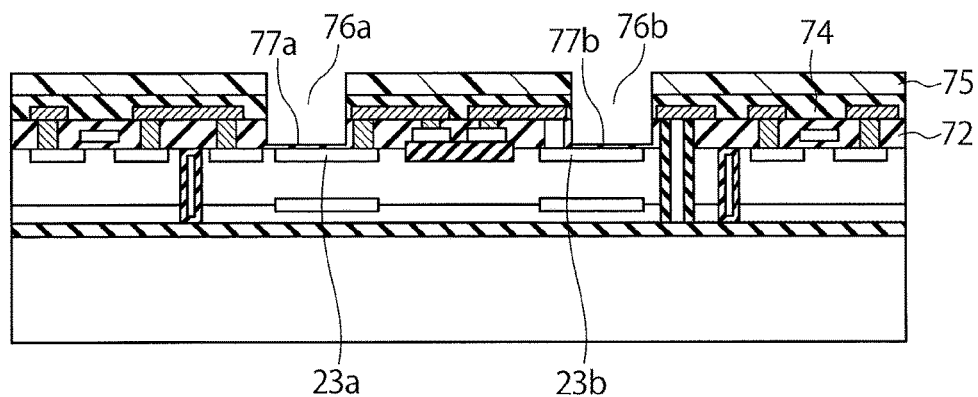

Thereafter, a mask 75 of a photoresist, for example, is formed on the insulating film 74 as shown in FIG. 5. Openings are formed in the mask 75 immediately above the p$^+$-type semiconductor layers 23a and 23b of the photo-sensing devices 20a and 20b by, for example, dry etching. The insulating film 74 is etched by a reaction gas such as CF$_4$ using the mask 75 to form openings 76a and 76b in the insulating film 74. A thin insulating layer 77a having a thickness of 1 μm, for example, is left on the bottom of the opening 76a, and a thin insulating layer 77b having a thickness of 1 μm, for example, is left on the bottom of the opening 76b. The thickness of the insulating layers 77a and 77b is controlled by controlling the time of the dry etching.

Figure 6:
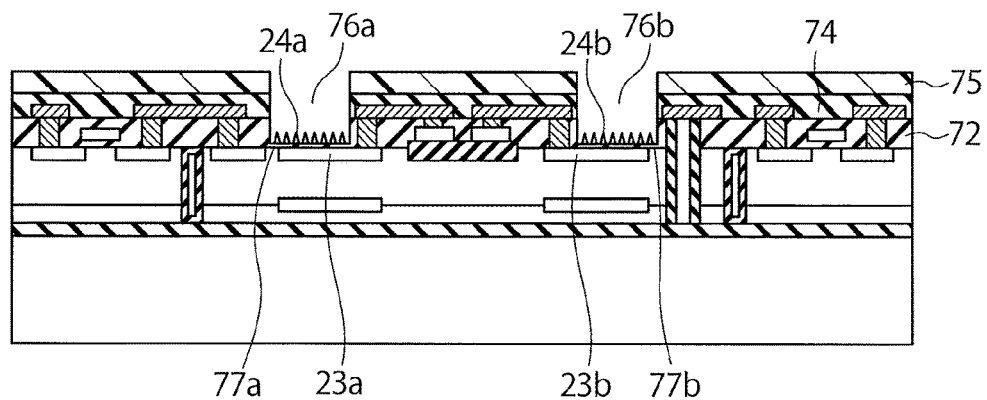

Subsequently, light reflecting members 24a and 24b are formed on the insulating layers 77a and 77b, respectively, as shown in FIG. 6. The light reflecting members 24a and 24b are formed of at least one metal selected from the group consisting of Ag, Al, Au, Cu, Ni, Pt, Ti, Cr, Mo, and W by, for example, sputtering. The surfaces of the light reflecting members 24a and 24b may have three-dimensional projections and depressions by etching or laser irradiation on the surface of the metal film formed by the sputtering. The projections and depressions may improve the reflection of the holes.

Figure 7:
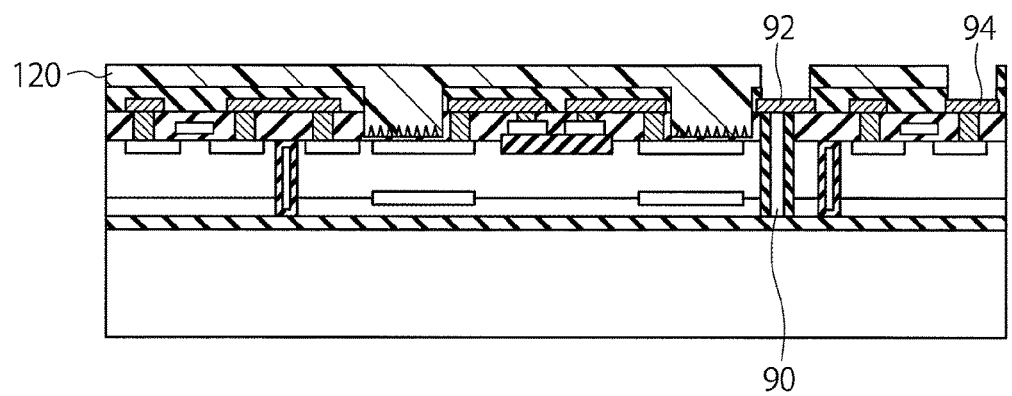

After the mask 75 shown in FIG. 6 is removed, a photoresist, for example, is applied to the insulating film 74. Openings are formed in the photoresist immediately above the pad 94 for a front electrode and a pad 92 for a back electrode using a photolithographic technique to form a mask 120. Dry etching is performed on the insulating film 74 using the mask 120 to expose the surfaces of the pad 94 and the pad 92 (FIG. 7). Thereafter, the mask 120 is removed.

Figure 8:
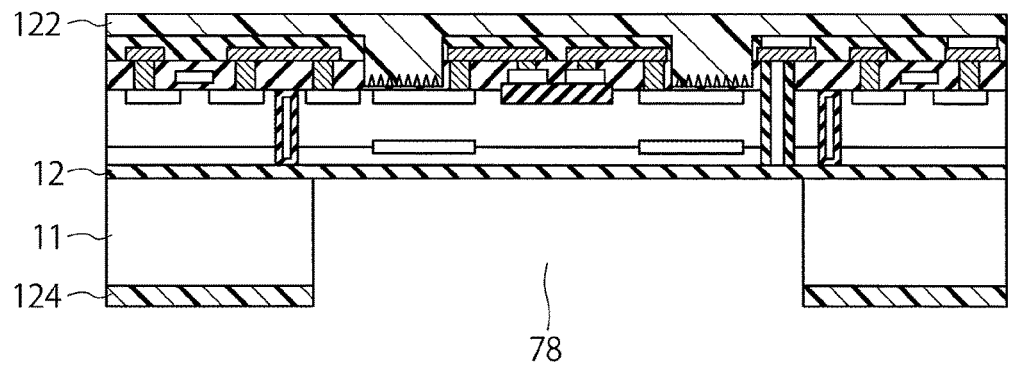

Subsequently, a protective member 122 of a photoresist is formed on the side where the light reflecting members are formed, and a mask 124 of a photoresist is formed on the side where the support substrate is formed, as shown in FIG. 8. The mask 124 has an opening in a region corresponding to the photodetector region 30. Dry etching of the support substrate 11 is performed with a reaction gas such as $SF_6$, using the mask 124. If a reaction gas having etching selectivity between the silicon support substrate 11 and the BOX film 12 is used in the dry etching, the BOX film 12 may be used as an etching stopper film. If the silicon support substrate 11 is too thick, a polishing process such as back-grinding and chemical mechanical polishing (CMP), or wet etching may also be used. During wet etching, KOH or TMAH (Tetra-methyl-ammonium hydroxide) etchant may be used. As a result, the opening 78 is formed through the support substrate 11 and the BOX film 12 is exposed.

Figure 9:
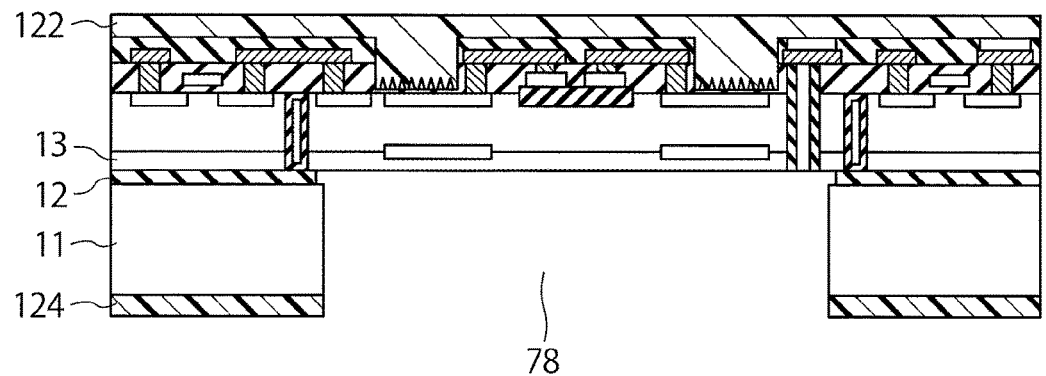

Thereafter, the BOX film 12 exposed is removed by etching to expose a part of the n-type semiconductor layer 13 corresponding to the photodetector region 30, as shown in FIG. 9. Wet etching with hydrofluoric acid may be used in this process to ensure sufficient etching selectivity with respect to silicon and to selectively remove the exposed BOX film 12.

Figure 10:
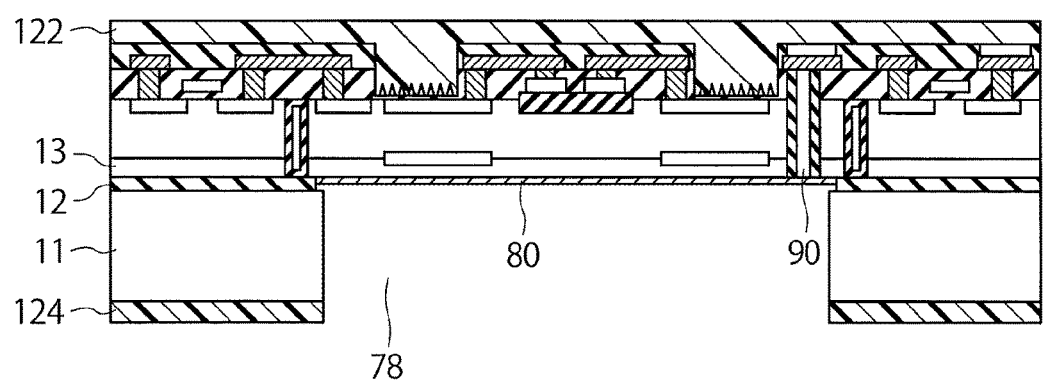

Next, a transparent electrode 80 is formed on the surface of the exposed n-type semiconductor layer 13 as shown in FIG. 10. The electrode 80 is formed of ITO, for example, by sputtering and electrically connected to the through-electrode 90. The manufacturing of the photodetector 1 shown in FIG. 1 is completed by removing the protective member 122.

The transparent electrode 80 formed on the n-type semiconductor layer 13 serves as a common cathode for the photo-sensing devices 20a and 20b to apply a potential to the photo-sensing devices 20a and 20b. As a result, a bias voltage may be applied from the front side of the photo-sensing devices 20a and 20b to the cathode via the through-electrode 90.

Using this manufacturing method, the photodetector region 30 and the CMOS circuit region 40 both including the n-type semiconductor layer 13 and the p⁻-type semiconductor layer region 22 can be formed on the SOI substrate 10.

In this manufacturing method, the through-electrode 90 is formed while the photo-sensing devices 20a and 20b, and the CMOS circuit are formed. However, the through-electrode 90 may be formed after the photo-sensing devices 20a and 20b and the CMOS circuit are formed.

Figure 11:
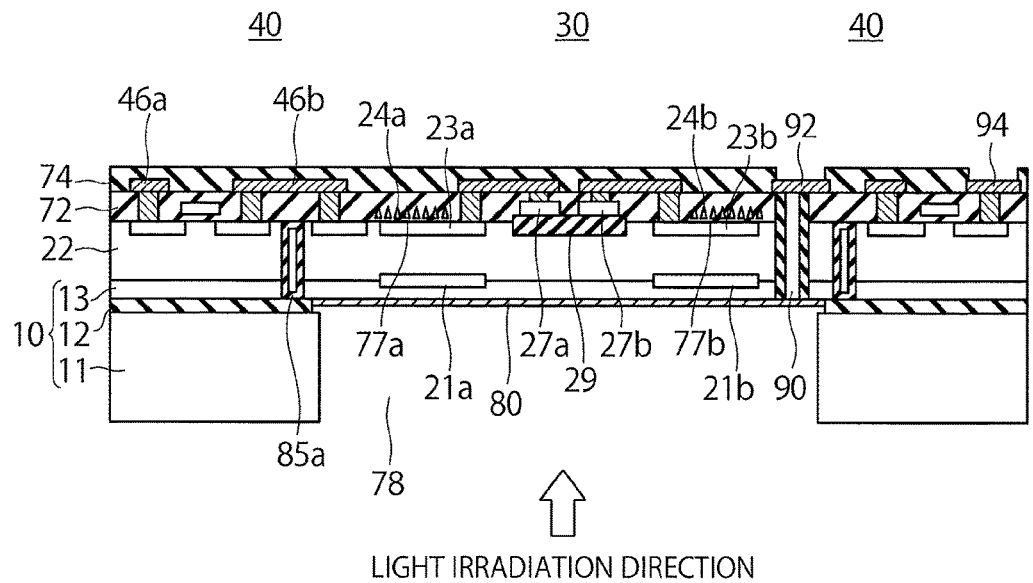
FIGS. 11 and 12 are cross-sectional views illustrating another process of manufacturing the photodetector according to the first embodiment.

Furthermore, in this manufacturing method, the openings are formed through the insulating films 72 and 74 to form the light reflecting members 24a and 24b of a metal on the very thin insulating layers 77a and 77b after the photo-sensing devices 20a and 20b and the periphery region 40 are formed as shown in FIGS. 5 and 6. However, the light reflecting members 24a and 24b may be formed while the photodetector region 30 and the periphery region 40 are formed as shown in FIG. 11. The light reflecting members 24a and 24b may be formed of a silicide material such as WSi, TiSi, CoSi, and NiSi. The light reflecting members 24a and 24b may also be formed by making openings by a via opening process of a generally employed multilayer wiring forming process, and filling the openings with a barrier metal such as Ti and W.

Figure 12:
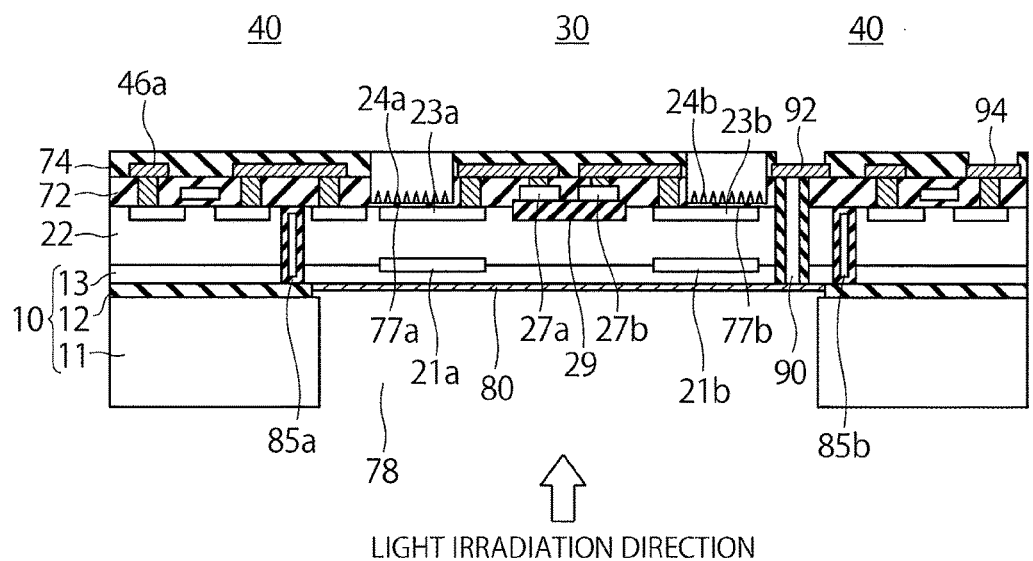

The light reflecting members 24a and 24b may also be formed after the photo-sensing devices 20a and 20b and the periphery region 40 are formed by making openings, processing the very thin insulating films by etching or laser irradiation to have projections and depressions, and filling a suitable material for the light reflecting members 24a and 24b in the openings, as shown in FIG. 12. The light reflecting members 24a and 24b may also be formed by Au plating or Cu plating, or sputtering of at least one metal element selected from Ag, Al, Au, Cu, Ni, Pt, Ti, Cr, and W.

Figure 13:
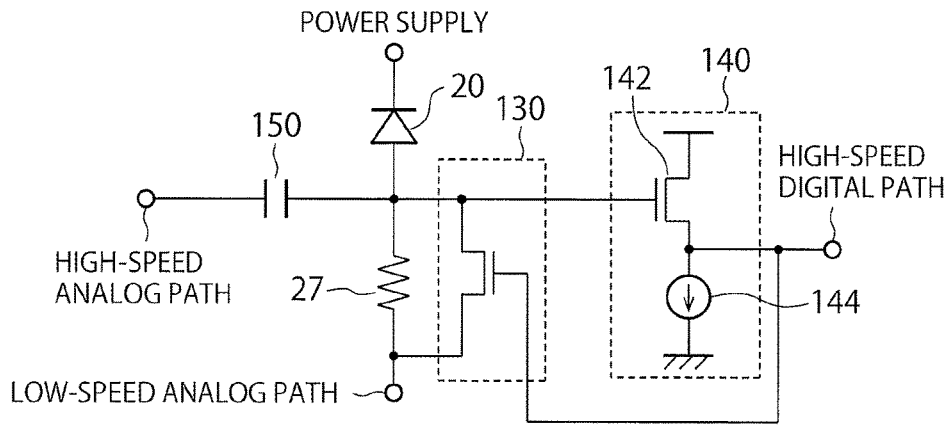
FIG. 13 is a circuit diagram illustrating an example of an active quenching circuit.

An active quenching circuit capable of actively terminating the Geiger discharge of the photo-sensing device 20 will be described with reference to FIG. 13. FIG. 13 is a circuit diagram illustrating an example of the active quenching circuit, in which a photo-sensing device 20 operating in the Geiger mode and a quenching resistor 27 are connected in series with each other, a reset transistor 130 for active quenching is connected in parallel with the series-connected photo-sensing device 20 and quenching resistor 27, and an amplifier circuit 140 for amplifying signals is connected to the anode terminal of the photo-sensing device 20. The amplifier circuit 140 includes a transistor 142 and a current source 144 connected in series with the transistor 142.

The output terminal of the amplifier circuit 140 is connected to the gate of the reset transistor 130. The source of the reset transistor 130 is connected between the anode terminal of the photo-sensing device 20 and the amplifier circuit 140. The drain of the reset transistor 130 is connected between the output terminal of a low-speed analog path and the quenching resistor 27. A direct-current component removal capacitor 150 is connected by AC coupling to the anode terminal of the photo-sensing device 20 to serve as means for reading high-speed analog signals.

The amplifier circuit 140 amplifies the potential at the anode terminal of the photo-sensing device 20 and outputs a power supply level signal via a high-speed digital path. The output of the amplifier circuit 140 is sent to the gate of the reset transistor 130 through a feedback path. This triggers the reset transistor 130 to perform a reset operation. After the discharge is finished, the potential at the anode terminal of the photo-sensing device 20 is set to a reset level, and the output of the amplifier circuit 140 is reset to the GND level. As a result, the reset operation is performed at a heir speed than a reset operation based on the electric discharge time constant of the quenching resistor 27 and the capacitance of the depletion layer in the photo-sensing device 20.

The photodetector according to the first embodiment having the aforementioned structure is capable of reflecting light that cannot be absorbed by a conventional thick depletion layer on the light reflecting members disposed on the front surface (the surface opposite to the light incident surface) of the substrate, and elongating the effective optical path length. This improves the light absorption ratio.

Since light enters the back side of the substrate, the quenching resistors and the wiring lines that have conventionally been deposed on the light incident side do not restrict the aperture ratio. Therefore, the aperture ratio can be considerably improved.

The first embodiment differs from the conventional structures in forming of the light reflecting members and thinning of the substrate by polishing. Therefore, the first embodiment does not need a novel device design and process development, as well as new conditions for driving the device. As a result, the process repeatability may be improved, and the sensitivity to the near-infrared wavelength band may be considerably improved without the fear of increased costs by the improvement in the absorption ratio and the aperture ratio.

Since the light reflecting members are not disposed directly on the silicon surface on which diodes (photo-sensing devices) are disposed but via a very thin insulating film, generation of crystal defects in the silicon layer on which diodes are formed may be avoided. Furthermore, the use of the SOI substrate to form the SiPM may enable a vertical APD and a CMOS circuit to be formed on the same substrate.

As described above, according to the first embodiment, a photodetector having a high sensitivity in detecting light in the near-infrared wavelength band may be provided.

Second Embodiment

Figure 14:
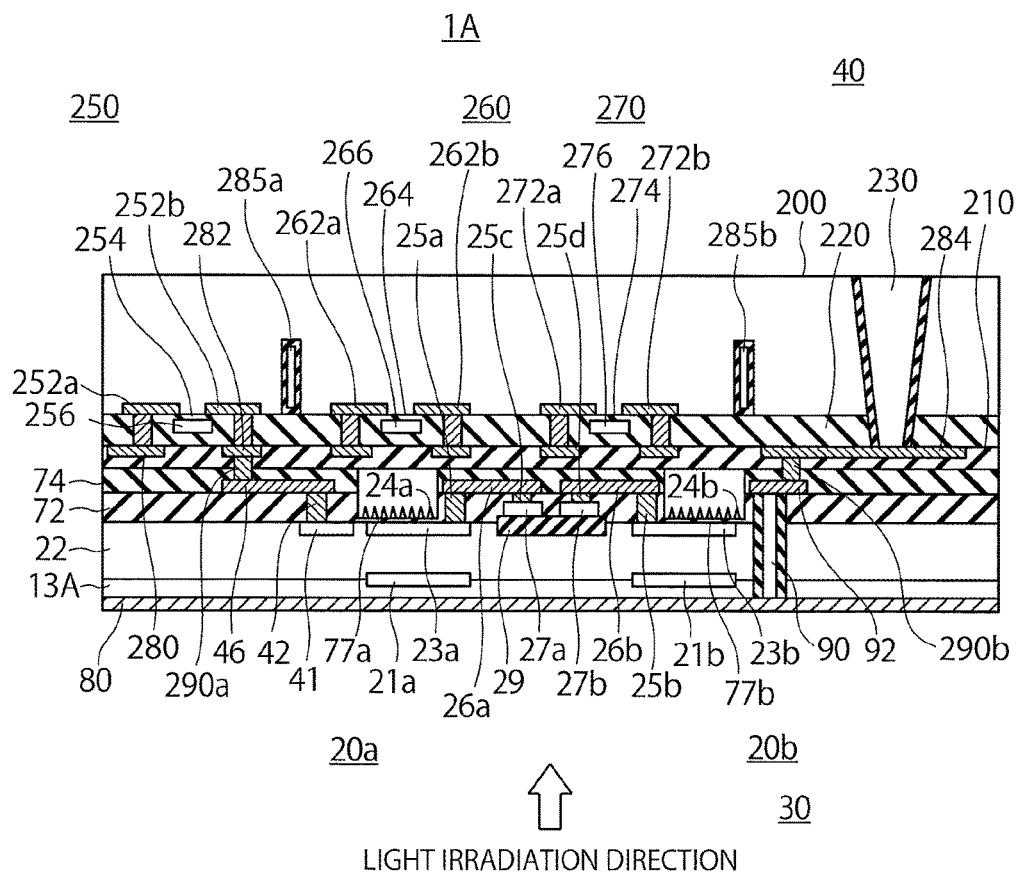
FIG. 14 is a cross-sectional view illustrating a photodetector according to a second embodiment.

FIG. 14 shows a cross section of a photodetector according to a second embodiment.

In the first embodiment, the photodetector region 30 and the CMOS circuit region (periphery region) are formed on a single SOI substrate.

The photodetector 1A according to the second embodiment has a structure in which a photodetector region 30 is formed on a first substrate, a CMOS circuit 40 is formed on a second substrate, and the first substrate and the second substrate are bonded together so that the surface on which the photodetector region 30 is formed faces the surface on which the CMOS circuit 40 is formed. Therefore, unlike the first embodiment, the first substrate on which the photodetector region 30 is formed may not necessarily be an SOI substrate. In the second embodiment, an n-type semiconductor layer 13A is used as the first substrate, and a p-type semiconductor layer 200 is used as the second substrate.

The photodetector 1A according to the second embodiment includes a plurality of photo-sensing devices 20a and 20b.

The photo-sensing device 20a includes a part of the n-type semiconductor layer 13A, a $p^{30}$-type semiconductor layer 21a disposed on the part of the n-type semiconductor layer 13A, a part of a p⁻-type semiconductor layer 22, a p⁺-type semiconductor layer 23a disposed on the p⁻-type semiconductor layer 22, a light reflecting member 24a disposed on the p⁺-type semiconductor layer 23a, a contact 25a on the $p^{30}$-type semiconductor layer 23a, a wiring line 26a connecting to the contact 25a, and a quenching resistor 27a connecting to the wiring line 26a. An impurity region (conductor region) 41 is disposed on the part of the p⁻-type semiconductor layer 22 included in the photo-sensing device 20a.

The photo-sensing device 20b includes a part of the n-type semiconductor layer 13A, a $p^{30}$-type semiconductor layer 21b disposed on the part of the n-type semiconductor layer 13A, a part of the p⁻-type semiconductor layer 22, a p⁺-type semiconductor layer 23b disposed on the part of the p⁻-type semiconductor layer 22, a light reflecting member 24b disposed on the p⁺-type semiconductor layer 23b, a contact 25b on the p⁺-type semiconductor layer 23b, a wiring line 26b connecting to the contact 25b, and a quenching resistor 27b connecting to the wiring line 26b. In the second embodiment, the photo-sensing devices 20a and 20b are vertical photodiodes.

A transparent electrode 80 is disposed on the n-type semiconductor layer 13A in the photodetector region 30 on a surface opposite to the photo-sensing devices 20a and 20b. The transparent electrode 80 is formed of an electrode material transmitting target near-infrared rays (with a wavelength of 850 nm, for example) such as indium tin oxide (ITO), and serves as a common electrode for the photo-sensing devices 20a and 20b. Light enters the photodetector 1A from the side where the transparent electrode 80 is present. The photo-sensing devices 20a and 20b are connected in parallel with each other like those in the first embodiment.

The quenching resistors 27a and 27b and the impurity region (conductor region) 41 disposed on the p⁻-type semiconductor layer 22 in the photodetector region 30 are covered by an interlayer insulating film 72. The wiring lines 26a and 26b are disposed on the interlayer insulating film 72 in the photodetector region 30. One end of the wiring line 26a is connected to the p⁺-type semiconductor layer 23a via the contact 25a formed in the interlayer insulating film 72, and the other end is connected to the quenching resistor 27a via a contact 25c formed in the interlayer insulating film 72. One end of the wiring line 26b is connected to the p⁺-type semiconductor layer 23b via the contact 25b in the interlayer insulating film 72, and the other end is connected to the quenching resistor 27b via a contact 25d in the interlayer insulating film 72.

Wiring line 46 is disposed on the interlayer insulating film 72 in the peripheral region 40. The wiring line 46 connects to the impurity region 41 via a contact 42.

The wiring lines 26a and 26b in the photodetector region 30 and the wiring line 46 in the peripheral region 40 are covered by an interlayer insulating film 74. The interlayer insulating films 72 and 74 have openings in regions where the light reflecting members 24a and 24b of the photo-sensing devices 20a and 20b are disposed. The light reflecting members 24a and 24b are exposed in the openings. The light reflecting members 24a and 24b are disposed on the $p^{30}$-type semiconductor layers 23a and 23b via thin insulating layers 77a and 77b.

The interlayer insulating film 74 has another opening in which a pad 92 connecting to a through-electrode 90 is disposed.

As described above, the photo-sensing devices 20a and 20b are vertical photodiodes. Therefore, a potential is applied to the upper and lower electrodes of the photo-sensing devices 20a and 20b. A front electrode of the photo-sensing devices 20a and 20b is connected to anodes of the photo-sensing devices 20a and 20b and the I/O terminal of a CMOS circuit. A back electrode 80, which corresponds to cathodes of the photo-sensing devices 20a and 20b, is separately formed. The through-electrode 90 serves as a wiring line that is in contact with the electrode 80 used as the cathodes later. A terminal of the through-electrode 90 is connected to the surface of the photodetector 1A.

The through-electrode 90 connects to the electrode 80 through the interlayer insulating film 72, the p⁻-type semiconductor layer 22, and the n-type semiconductor layer 13A. The through-electrode 90 has a structure in which a conductor is surrounded by an insulating material that electrically insulates conductors of the n-type semiconductor layer 13A and the p⁻-type semiconductor layer 22 from the conductor of the through-electrode 90.

The CMOS circuit is disposed on the p-type semiconductor layer 200, and includes, for example, n-channel MOS transistors 250, 260, and 270.

The transistor 250 includes a source 252a and a drain 252b that are separately disposed in the p-type semiconductor layer 200, a gate insulating film 254 disposed between the source 252a and the drain 252b, and a gate electrode 256 disposed on the gate insulating film 254. The transistor 260 includes a source 262a and a drain 262b that are separately disposed in the p-type semiconductor layer 200, a gate insulating film 264 disposed between the source 262a and the drain 262b, and a gate electrode 266 disposed on the gate insulating film 264. The transistor 270 includes a source 272a and a drain 272b that are separately disposed in the p-type semiconductor layer 200, a gate insulating film 274 disposed between the source 272a and the drain 272b, and a gate electrode 276 disposed on the gate insulating film 274.

The transistors 260 and 270 are disposed in regions in the p-type semiconductor layer 200 corresponding to the regions of the photo-sensing devices 20a and 20b, and form, for example, a readout circuit configured to read out signals sensed by the photo-sensing devices 20a and 20b. The transistor 250 serves as a processing circuit configured to process the signals read by the readout circuit. The region where the transistor 250 is disposed and the region where the transistors 260 and 270 are disposed are electrically isolated by device isolation structures 285a and 285b including DITs. The device isolation structures 285a and 285b may surround the transistors 260 and 270.

The transistors 250, 260, and 270 are covered by an insulating film 220. Wiring lines such as wiring lines 280, 282, and 284 connecting to the sources and the drains of the transistors 250, 260, and 270 are disposed on the insulating film 220. The wiring lines connect to the sources and the drains via contacts in the insulating film 220.

A through-electrode 230 is disposed in the p-type semiconductor layer 200. The through-electrode 230 is disposed in an opening penetrating the p-type semiconductor layer 200 and the insulating film 220. The side surface of the opening is oxidized, and the opening is filled with a conductor such as a metal to form the through-electrode 230. The through-electrode 230 is electrically connected to the wiring line 284 disposed on the insulating film 220.

The wiring line 282 of the CMOS circuit 40 is connected to the wiring line 46 in the photodetector region 30 via a connection wiring line 290a. The wiring line 284 connecting to the through-electrode 230 of the CMOS circuit 40 and the pad 92 connecting to the through-electrode 90 of the photodetector region 30 are connected to each other by a connection wiring line 290b.

Like the first embodiment, the second embodiment with the aforementioned structure is capable of reflecting light that cannot be absorbed with a conventional thickness of a depletion layer by means of reflection members disposed on the front surface (the surface opposite to the light incident surface) of the substrate, and elongating the effective optical path length. This improves the light absorption ratio.

Since light enters the back side of the substrate, the quenching resistors and the wiring lines that have conventionally been deposed to the light incident side do not restrict the aperture ratio. Therefore, the aperture ratio can be considerably improved.

Since the substrate with the light detection region differs from the substrate with the CMOS circuit, the second embodiment does not need a novel device design and process development, as well as new conditions for driving the device. As a result, the process repeatability may be improved, and the sensitivity in the near-infrared wavelength band may be considerably improved without the fear of increased costs by the improvement in absorption ratio and the aperture ratio.

Since the reflection members are not disposed directly on the silicon surface on which diodes (photo-sensing devices) are disposed but via a very thin insulating film, generation of crystal defects in the silicon layer on which diodes are formed may be avoided.

As described above, according to the second embodiment, a photodetector having a high sensitivity in detecting light in the near-infrared wavelength band may be provided.

Third Embodiment

Figure 15:
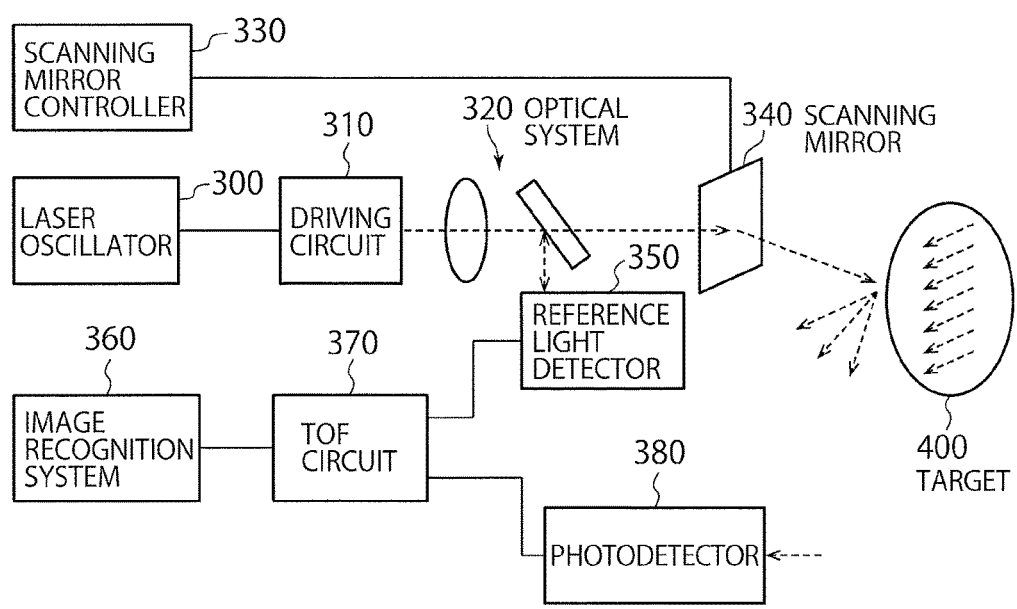
FIG. 15 is a block diagram illustrating a LIDAR system according to a third embodiment.

FIG. 15 shows a laser imaging detection and ranging (LIDAR) system according to a third embodiment. The LIDAR system according to the third embodiment is a range image sensing system employing a time of flight (TOF) method, in which time during which a laser beam goes to and from a target is measured, and the time is converted to a distance. This system is applied to a vehicle-mounted driver assistance system, remote sensing, and so on.

The LIDAR system according to the third embodiment includes a light projection unit and a light reception unit as shown in FIG. 15. The light projection unit includes a laser oscillator 300 configured to emit a laser beam, a driving circuit 310 configured to drive the laser beam, an optical system 320 configured to extract a part of the driven laser beam as a reference light beam and to emit the remaining laser beam to a target 400 via a scanning mirror 340, and a scanning mirror controller 330 configured to control the scanning mirror 340 to emit the laser beam toward the target 400.

The light reception unit includes a reference light detector 350 configured to detect the reference light extracted by the optical system 320, a photodetector 380 configured to receive reflection light from the target 400, a time of flight (TOF) circuit 370 configured to measure a range to the target 400 based on the reference light detected by the reference light photodetector 350 and the reflection light detected by the photodetector 380, and an image recognition system 360 configured to recognize the target 400 as an image based on a measurement result obtained by the TOF circuit 370. In the third embodiment, the reference light detector 350 and the photodetector 380 are photodetectors according to the first or second embodiment.

The photodetectors according to the first and the second embodiment have good sensitivity in the near-infrared ray range. Therefore, the LIDAR system according to the third embodiment may be applied to a light source in a wavelength band that cannot be seen by human beings. For example, the LIDAR system may be applied to vehicle obstacle detection.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A photodetector comprising:
   a first semiconductor layer of a first conductivity type, including a first surface and a second surface that is opposite to the first surface;
   a second semiconductor layer of a second conductivity type, disposed on the second surface;
   at least one photo-sensing device including a region in the first semiconductor layer, a region in the second semiconductor layer, and a first electrode disposed in a first region of the first surface; and
   a substrate disposed in a second region that is different from the first region of the first surface of the first semiconductor layer, and an insulating film disposed between the substrate and the second region of the first surface of the first semiconductor layer.

2. The photodetector according to claim 1, further comprising a reflecting member disposed on the region of the second semiconductor layer.

3. The photodetector according to claim 2, wherein the reflecting member contains a material that reflects light in a wavelength range from visible light to near-infrared light.

4. The photodetector according to claim 2, further comprising an insulating layer disposed between the region of the second semiconductor layer and the reflecting member.

5. The photodetector according to claim 1, further comprising a signal processing circuit disposed in a region of the second semiconductor layer outside the region in which the photo-sensing device is disposed, and configured to process a signal from the photo-sensing device.

6. The photodetector according to claim 5, further comprising a device isolation structure containing an insulating material for separating the region in which the photo-sensing device is disposed and the region in which the signal processing circuit is disposed.

7. The photodetector according to claim 1, further comprising a semiconductor substrate on which a signal processing circuit configured to process a signal from the photo-sensing device is disposed, the semiconductor substrate being disposed to face the second semiconductor layer.

8. The photodetector according to claim 1, further comprising a second electrode penetrating the first semiconductor layer and the second semiconductor layer to connect to the first electrode.

9. The photodetector according to claim 1, wherein the second semiconductor layer includes a first semiconductor region of the second conductivity type deposed on the region of the first semiconductor layer, a fourth semiconductor layer of the second conductivity type covering the first semiconductor region, being disposed on the second surface of the first semiconductor layer, and having an impurity concentration lower than that of the first semiconductor region, and a second semiconductor region of the second conductivity type being disposed on a region of the fourth semiconductor layer and having an impurity concentration higher than that of the fourth semiconductor layer.

10. The photodetector according to claim 9, wherein the second semiconductor region is disposed above the first semiconductor region.

11. The photodetector according to claim 9, wherein the photo-sensing device includes a resistor connecting to the second semiconductor region.

12. The photodetector according to claim 1, wherein the at least one photo-sensing device is plural photo-sensing devices connected in parallel with each other.

13. The photodetector according to claim 11, wherein the signal processing circuit includes:
   a first transistor connected in series with the resistor;
   an amplifier circuit of which an input terminal is connected to the fifth semiconductor layer of the photo-sensing device, and an output terminal is connected to a gate of the first transistor; and
   a capacitor of which a first terminal is connected to the fifth semiconductor layer of the photo-sensing device, and a second terminal is connected to a high-speed digital path.

14. A LIDAR system comprising:
   a laser oscillator configured to emit laser beam;
   a driving circuit configured to drive the laser beam emitted; a scanning mirror;
   an optical system configured to extract, as a reference light, a part of the laser beam driven by the driving circuit, and emit remaining laser beam to a target via the scanning mirror;
   a controller configured to control the scanning mirror to emit the remaining laser beam to the target;
   a first photodetector configured to detect the reference light extracted by the optical system;
   a second photodetector configured to receive reflection light from the target;
   a time of flight circuit configured to measure a distance to the target based on the reference light detected by the first photodetector and the reflection light detected by the second photodetector; and
   an image recognition system configured to recognize the target as an image based on a result of measurement performed by the time of flight circuit,
   the second photodetector being the photodetector according to claim 1.

* * * * *